(12) United States Patent
Chung et al.

(10) Patent No.: US 11,381,209 B2
(45) Date of Patent: Jul. 5, 2022

(54) AUDIO SIGNAL PROCESSING METHOD AND APPARATUS FOR CONTROLLING LOUDNESS LEVEL AND DYNAMIC RANGE

(71) Applicant: GAUDIO LAB, INC., Seoul (KR)

(72) Inventors: Hyunjoo Chung, Seoul (KR); Sangbae Chon, Seoul (KR); Hyunoh Oh, Gyeonggi-do (KR); Jeonghun Seo, Seoul (KR)

(73) Assignee: GAUDIO LAB, INC., Seoul (KR)

(*) Notice: Subject to any disclaimer, the term of this patent is extended or adjusted under 35 U.S.C. 154(b) by 0 days.

(21) Appl. No.: 17/197,018

(22) Filed: Mar. 9, 2021

(65) Prior Publication Data

US 2021/0288626 A1 Sep. 16, 2021

Related U.S. Application Data

(60) Provisional application No. 62/988,414, filed on Mar. 12, 2020.

(51) Int. Cl.
*H03G 3/30* (2006.01)
*H04R 1/10* (2006.01)
*G06F 16/683* (2019.01)

(52) U.S. Cl.
CPC ......... *H03G 3/3005* (2013.01); *H04R 1/1083* (2013.01); *G06F 16/683* (2019.01); *H04R 2430/01* (2013.01)

(58) Field of Classification Search
CPC ...... H03G 3/3005; H03G 7/002; H03G 7/007; H04R 1/1083; H04R 2430/01; H04R 3/00; G06F 3/165; G06F 16/683
USPC ............................ 381/104, 107, 109; 700/94
See application file for complete search history.

(56) References Cited

U.S. PATENT DOCUMENTS

| | | | |
|---|---|---|---|
| 9,565,508 B1* | 2/2017 | Skovenborg | H03G 3/3005 |
| 10,356,545 B2* | 7/2019 | Chon | H04S 7/303 |
| 2007/0177743 A1* | 8/2007 | Mertens | H04N 21/439 |
| | | | 381/104 |
| 2008/0253586 A1* | 10/2008 | Wei | H03G 3/3005 |
| | | | 381/107 |
| 2016/0266865 A1* | 9/2016 | Tsingos | G06F 3/165 |
| 2017/0094409 A1* | 3/2017 | Baumgarte | H03G 5/165 |
| 2021/0084426 A1* | 3/2021 | Chung | H04S 3/008 |
| 2021/0111686 A1* | 4/2021 | Chon | H03G 7/002 |

* cited by examiner

*Primary Examiner* — Xu Mei
(74) *Attorney, Agent, or Firm* — Ladas & Parry, LLP (57) ABSTRACT

Disclosed is a method of operating an audio signal processing apparatus playing content including an audio signal. The method includes receiving the audio signal, receiving metadata including information related to a loudness of the audio signal, the metadata including loudness distribution information indicating, for each of a plurality of steps separated according to a loudness magnitude, a ratio between an amount of the audio signal corresponding to each of the plurality of steps of the audio signal and a total amount of the audio signal, and adjusting the loudness of the audio signal based on the metadata.

20 Claims, 7 Drawing Sheets

| Syntax | No. of bytes |
|---|---|
| loudnessDistribution() <br> { <br>   meta.loudDist.type; <br>   meta.loudDist.min = bsMin / 65535.0f * -90; <br>   meta.loudDist.max = bsMax / 65535.0f * -90; <br>   meta.loudDist.step = bsStep / 65535.0f * 90; <br>   meta.loudDist.numSteps; <br>   for (n=0; n<meta.loudDist.numSteps; n++) { <br>     bsRatio = readFlexible(); <br>     meta.loudDist.ratio[n] = bsRatio / 65535.0f; <br>   } <br> } | <br><br>1<br>2<br>2<br>2<br>2<br><br>1..5<br> |

AUDIO SIGNAL PROCESSING METHOD AND APPARATUS FOR CONTROLLING LOUDNESS LEVEL AND DYNAMIC RANGE

TECHNICAL FIELD

The present disclosure relates to a method and apparatus for processing an audio signal to effectively reproduce the audio signal, and more particularly, to a method and apparatus for processing an audio signal to provide a more immersive feeling to a user by adjusting a loudness level at which an audio signal of content is output.

BACKGROUND ART

As methods for providing audio to a user have transitioned from analog to digital, the volume can be expressed in a wider range. In addition, according to the trend, the volumes of an audio signal are diversifying depending on the content corresponding to the audio signal. This is because, in the process of producing audio content, intended loudness may be set differently for each audio content. Accordingly, international standards groups such as the International Telecommunication Union (ITU) and the European Broadcasting Union (EBU) have issued standards for audio loudness. However, the method and the regulations for measuring loudness are different from country to country, and thus there is a problem that it is difficult to apply the standards issued by the international standards groups.

Content creators attempt to produce content with relatively large loudness mixed and provide it to users. This is due to the psychological acoustic characteristics that when the volume of the audio signal increases, the sound quality of the audio signal is perceived to be improved. Accordingly, there has been a competition called the loudness war. As a result, within the content or between multiple contents, a difference in loudness occurs, and the user may experience inconvenience of repeatedly controlling the volume of an apparatus in which the corresponding contents are played. Therefore, a technique for normalizing the loudness of audio content is required for the convenience of a user using a content playback apparatus.

DISCLOSURE

Technical Problem

An object of an embodiment of the present disclosure is to effectively adjust an output loudness level of content including an audio signal in an audio signal processing method for playing the content.

Technical Solution

According to an aspect of the present disclosure, there is provided a method of operating an audio signal processing apparatus playing content including an audio signal, the method including: receiving the audio signal; receiving metadata including information related to a loudness of the audio signal, the metadata including loudness distribution information indicating, for each of a plurality of steps separated according to a loudness magnitude, a ratio between an amount of an audio signal corresponding to each of the plurality of steps of the audio signal and a total amount of the audio signal; and adjusting the loudness of the audio signal based on the metadata.

A value of the ratio for each of the plurality of steps may be encoded with a variable length.

The metadata may include a bit string including a value of the ratio corresponding to each of the plurality of steps separated according to the loudness magnitude, and the bit string may include an ending flag repeatedly positioned by a predetermined number and indicating an end of bits representing the ratio corresponding to each of the plurality of steps.

The adjusting the loudness of the audio signal based on the metadata may include obtaining a value of the ratio for each of the plurality of steps by using a bit operation below.

| Syntax | No. of bytes |
| --- | --- |
| value = readFlexible( )<br>{<br>  value = 0:<br>  for (n=0: n<5: n++) {<br>    byte:<br>    value += (0x7F & byte) <<(7 * n):<br>    if (!(0x80 & byte)) break:<br>  }<br>  return value:<br>} | 1 |

The metadata may include information indicating a type of loudness that is a reference to the loudness distribution information. In this case, the type of loudness may be classified according to a length of a time interval in which the loudness is measured.

The adjusting the loudness of the audio signal based on the metadata may include adjusting the loudness of the audio signal based on the loudness distribution information and a characteristic of nonlinear processing applied to the audio signal.

The nonlinear processing may include dynamic range control (DRC).

The adjusting the loudness of the audio signal based on the loudness distribution information and the characteristic of the nonlinear processing applied to the audio signal may include adjusting the loudness based on a difference between a target loudness and a value obtained by adding a loudness deviation caused by the nonlinear processing to the loudness of the audio signal.

According to another aspect of the present disclosure, there is provided a method of generating metadata for content including an audio signal, the method including: obtaining loudness distribution information of the audio signal, the loudness distribution information indicating, for each of a plurality of steps separated according to a loudness magnitude, a ratio between an amount of an audio signal corresponding to each of plurality of steps of the audio signal and a total amount of the audio signal; and inserting the loudness distribution information in the metadata.

The inserting the loudness distribution information in the metadata may include encoding the ratio for each of the plurality of steps with a variable length.

The metadata may include a bit string including the audio signal ratio corresponding to each of the plurality of steps separated according to the loudness magnitude, and the bit string may include an ending flag repeatedly positioned by a predetermined number and indicating an end of bits representing the audio signal ratio corresponding to each of the plurality of steps.

The ending flag may be repeatedly positioned every 8 bits in the bit string. The metadata may include information indicating a type of loudness that is a reference to the loudness distribution information.

The type of loudness may be classified according to a length of a time interval in which the loudness is measured.

According to still another aspect of the present disclosure, there is provided an audio signal processing apparatus playing content including an audio signal, the audio signal processing apparatus including: a receiver receiving the audio signal; and a processor controlling the audio signal processing apparatus.

The processor may be configured to: receive metadata including information related to a loudness of the audio signal, the metadata including loudness distribution information indicating, for each of a plurality of steps separated according to a loudness magnitude, a ratio between an amount of an audio signal corresponding to each of the plurality of steps of the audio signal and a total amount of the audio signal; and adjust the loudness of the audio signal based on the metadata.

A value of the ratio for each of the plurality of steps may be encoded with a variable length.

The metadata may include a bit string including the value of the ratio corresponding to each of the plurality of steps separated according to the loudness magnitude. In this case, the bit string may include an ending flag repeatedly positioned by a predetermined number and indicating an end of bits representing the ratio corresponding to each step.

The processor may be configured to obtain the value of the ratio for each of the plurality of steps by using a bit operation below.

| Syntax | No. of bytes |
| --- | --- |
| value = readFlexible( )<br>{<br>  value = 0:<br>  for (n=0: n<5: n++) {<br>    byte:<br>    value += (0x7F & byte) <<(7 * n):<br>    if (!(0x80 & byte)) break:<br>  }<br>  return value:<br>} | 1 |

The metadata may include information indicating a type of loudness that is a reference to the loudness distribution information.

Advantageous Effects

An embodiment of the present invention is to provide an audio signal processing method and apparatus for frequency spectrum adjusting.

MODE FOR CARRYING OUT THE INVENTION

Hereinafter, embodiments of the present disclosure will be described in detail with reference to the accompanying drawings so that those skilled in the art may easily perform the present disclosure. However, the present disclosure may be implemented by various modifications and is not limited to the embodiments described herein. In the drawings, in order to clarify the present disclosure, parts that are not related to description are omitted and like reference numerals represent like elements throughout the specification. In addition, when a part "includes" an element, unless described to the contrary, the term "includes" does not indicate that another element is excluded but instead indicates that the other element may be further included.

The present disclosure relates to a method of correcting an output loudness level of an input content by an audio signal processing apparatus. In the present disclosure, the input content may be content including an audio signal. In the present disclosure, the input content may be referred to as an input audio signal. In addition, loudness may indicate the magnitude of sound perceived through hearing. The loudness level may be a value representing loudness. For example, the loudness level may be displayed using units such as loudness K-weighted relative to full scale (LKFS) or loudness unit relative to full scale (LUFS). In addition, the loudness level may be indicated using units such as sone or phon.

Figure 1:
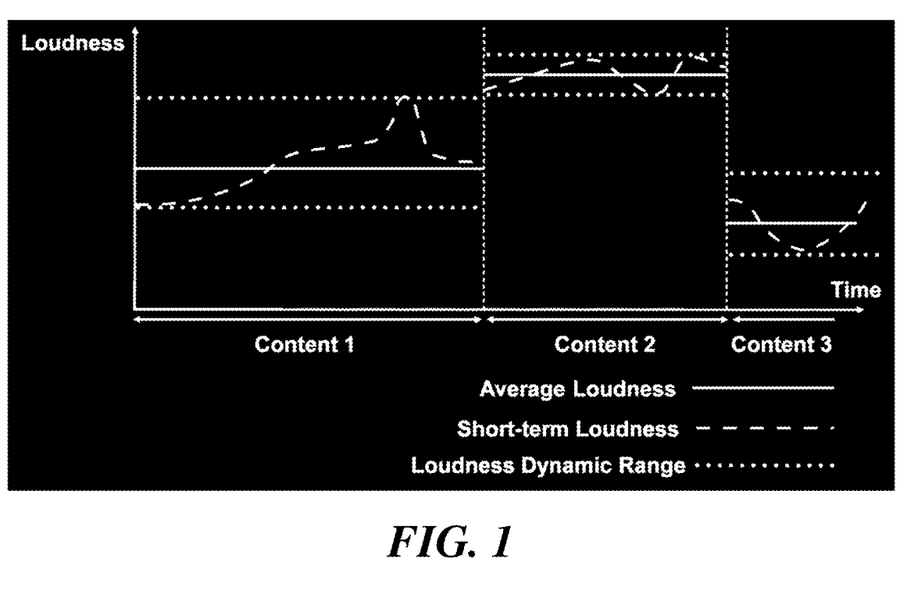
FIG. 1 is a diagram illustrating a loudness level that changes over time while multiple contents are being played according to an embodiment of the present disclosure.

Hereinafter, the loudness of the audio signal will be described with reference to FIG. 1. FIG. 1 is a diagram illustrating a loudness level that changes over time while multiple contents are being played according to an embodiment of the present disclosure. Referring to FIG. 1, an average loudness, a short-term loudness, and a loudness dynamic range that changes over time are illustrated. The average loudness level may be a single loudness value corresponding to one content. The average loudness level may be different for each content (content1, content2, and content3). In FIG. 1, a solid line represents the average loudness level for each content (content1, content2, and content3).

The short-term loudness level may be a measurement value of the loudness of a portion of the content. In this case, a portion of the content may be a portion included in one measurement time window. The audio signal processing apparatus may obtain a plurality of short-term loudness levels for one content. In addition, the average loudness level may be an average of a plurality of short-term loudness levels. In FIG. 1, each of a plurality of contents to be reproduced and switched has different loudness characteristics.

For example, when different contents are switched one on a platform that provides video service, interstitial advertisements may be inserted between the contents. In this case, it may be difficult for the audio signal processing apparatus to maintain a loudness level within a certain range. Further, a difference in loudness dynamic range between different contents may be large. In such an environment, it may be difficult for the audio signal processing apparatus to provide a loudness level within a range desired by a listener.

Specifically, when the contents are switched, the listener may first perceive a rapid change in the short-term loudness level. Accordingly, the listener may have to control the volume in the device for outputting the audio signal. In addition, the listener may have to control the volume again to set an appropriate gain based on the average loudness as the switched content is reproduced. For example, when the switched content is reproduced with the volume controlled based on the loudness of the initial section of the switched content, there may be a situation in which the loudness level increases rapidly or decreases rapidly depending on the characteristics of the content. When the loudness level increases or decreases rapidly and it is not possible to grasp the details of the content, the listener may have to control the volume of the device for outputting the audio signal again.

In this way, the audio signal processing apparatus according to an embodiment of the present disclosure may increase the convenience of the listener by controlling the output loudness level of the input content. Specifically, the audio signal processing apparatus may adjust the loudness level based on the loudness level of the input content. In this case, the gain applied to the content input in a specific section may be limited based on an allowable gain range.

According to an embodiment of the present disclosure, a loudness level of input content generated with different criteria or without a specific criterion may be normalized based on a target loudness level. Here, the target loudness level may be a loudness level to be output by the audio signal processing apparatus. For example, the target loudness level may be set by a content creator of the input content. In this case, the audio signal processing apparatus may receive information on target loudness together with the input content. For example, the target loudness level may be differently set depending on the genre of the input content. In this case, the audio signal processing apparatus may determine the target loudness level based on the genre of the input content. The target loudness level may be set to a default value previously stored in the audio signal processing apparatus. In this case, the target loudness level may be set to a value irrelevant to the input content or the genre of the input content. The audio signal processing apparatus may adjust the output loudness level of the input content based on the target loudness level.

According to an embodiment, the audio signal processing apparatus may obtain a loudness gain based on a relationship between the loudness level of the input content and the target loudness level. The relationship between the loudness level of the input content and the target loudness level may include a difference or ratio between the loudness level of the input content and the target loudness level.

For example, the audio signal processing apparatus may obtain a loudness gain based on a relationship between a representative loudness level of the input content and the target loudness level. Here, the representative loudness level may be a loudness level representing the loudness level for all sections of the input content. The audio signal processing apparatus may receive the representative loudness level of the input content together with the input content. Alternatively, the audio signal processing apparatus may obtain the representative loudness level based on the loudness information analyzed from the input content. In this case, the audio signal processing apparatus may obtain loudness information based on a loudness measurement value of the input content.

In addition, the audio signal processing apparatus may adjust the output loudness level of the input content based on the loudness gain. Specifically, the audio signal processing apparatus may obtain an output audio signal of which the loudness level is adjusted by applying the loudness gain to the input content.

Meanwhile, in certain circumstances, it may be difficult for the audio signal processing apparatus to obtain the representative loudness level of the input content until the playback of the input content is terminated. For example, when a specific content is transmitted in real time, it may be difficult for the audio signal processing apparatus to obtain the loudness characteristics of the entire content until it completes reception of all the content. In this way, the audio signal processing apparatus according to an embodiment of the present disclosure may perform loudness normalization by measuring the loudness of the received content in real time.

Hereinafter, a method for adjusting an output loudness level of an input content by an audio signal processing apparatus according to an embodiment of the present disclosure will be described with reference to FIG. 2.

Figure 2:
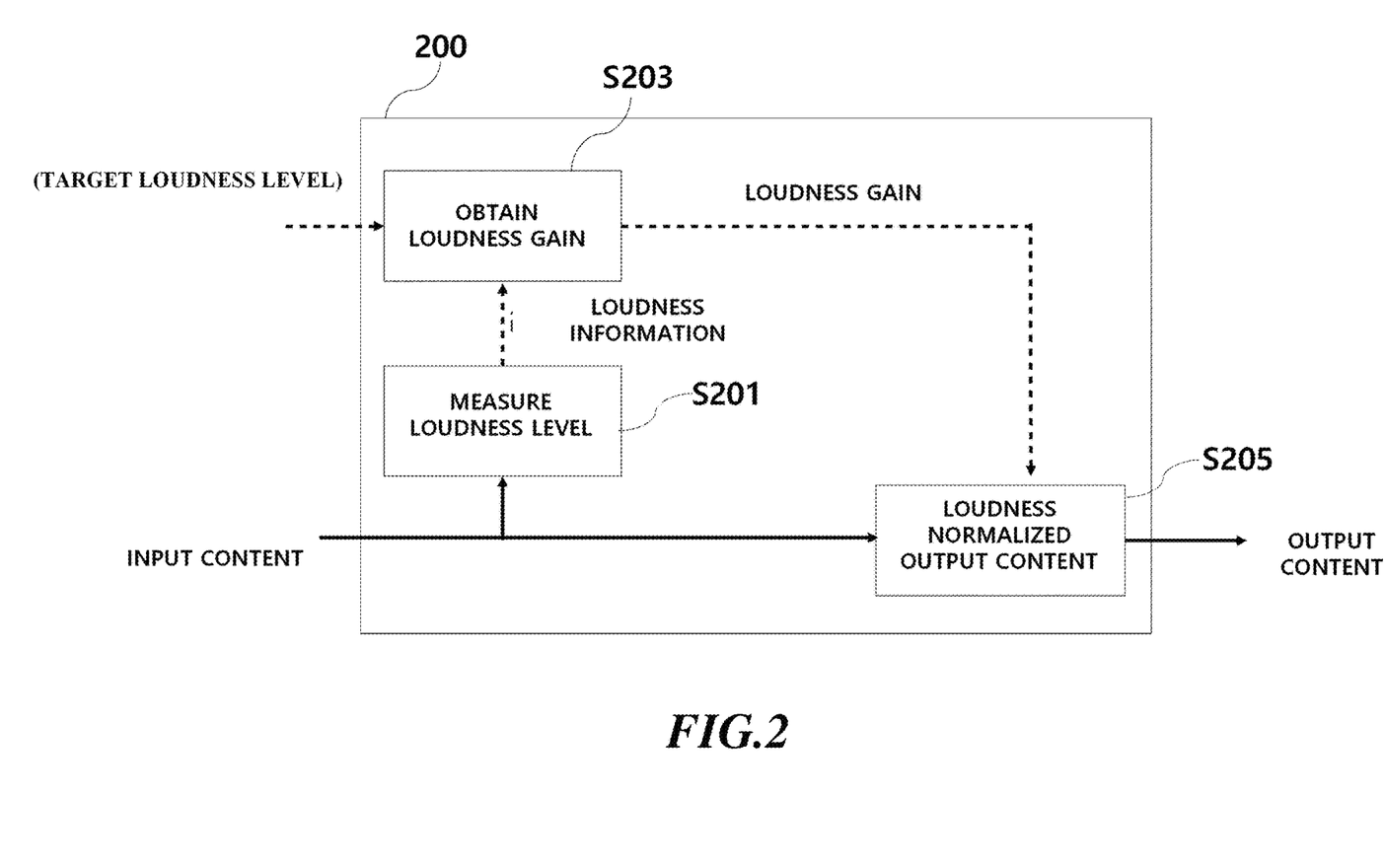
FIG. 2 is a block diagram illustrating an operation of an audio signal processing apparatus according to an embodiment of the present disclosure.

FIG. 2 is a block diagram illustrating an operation of an audio signal processing apparatus 200 according to an embodiment of the present disclosure. FIG. 2 illustrates that a series of operations for normalizing the loudness of input content are performed by the audio signal processing apparatus; however, the present disclosure is not limited thereto. For example, some of the operations described with reference to FIG. 2 may be performed through a server outside the audio signal processing apparatus.

First, the audio signal processing apparatus 200 may receive the input content. The input content may be an input audio signal composed of a plurality of frames. Next, the audio signal processing apparatus 200 may measure a loudness level of the input content (S201). The audio signal processing apparatus 200 may obtain a loudness measurement value of an audio signal by using an auditory scale-based loudness filter. Specifically, the loudness filter may be at least one of an inverse filter of equal-loudness contours or a K-weighting filter, which is the approximated version thereof.

For example, the audio signal processing apparatus 200 may obtain the loudness measurement value by applying the loudness filter in at least some sections of the previously received input content. Here, the section may be a time interval used to obtain one loudness measurement value. Some sections may include at least one frame. In the present disclosure, the time interval used to obtain one loudness measurement value may be referred to as a measurement window.

The audio signal processing apparatus 200 may obtain a loudness measurement value for each measurement window of the input content. In this case, the obtained loudness measurement value may be a momentary loudness level or a short-term loudness level according to the length of the measurement window. The momentary loudness level may be a loudness measurement value measured for a short time interval compared to the short-term loudness level. For example, the length of the measurement window used to obtain one momentary loudness level may be 400 milliseconds (ms). In addition, the length of the measurement window used to obtain one short-term loudness level may be 3 seconds. However, the present disclosure is not limited thereto. The length of the measurement window for loudness analysis may be different for each input content. According to an embodiment, the length of the measurement window may be determined based on additional information of the input content.

Next, the audio signal processing apparatus may obtain loudness information of the input content based on the loudness measurement value of the input content. The loudness information may include at least one loudness measurement value for the input content. In addition, the loudness information may include information obtained by performing calculation based on the loudness measurement value for the input content. The audio signal processing apparatus may update the loudness information in real time. For example, the loudness information may include at least one of an integrated loudness level, a short-term loudness level, and a momentary loudness level. The audio signal processing apparatus may obtain the integrated loudness level representing a plurality of loudness measurement values accumulated from a point of time when the loudness measurement for the input content is started to a current point of time.

In the present disclosure, the integrated loudness level may indicate a loudness measurement value accumulated from a setup point of time set in the audio signal processing apparatus. For example, the integrated loudness level may be obtained based on an average of effective loudness measurement values measured between the setup point of time and the current point of time. Here, the effective loudness measurement values may be loudness measurement values that satisfy at least one reference requirement among a plurality of loudness measurement values measured between the setup point of time and the current point of time.

For example, the effective loudness measurement values may be loudness measurement values in which the loudness level is equal to or higher than a specific level. First, the audio signal processing apparatus may calculate a first average of loudness measurement values having a loudness level equal to or greater than a first threshold value among a plurality of loudness measurement values. In this case, the first threshold value may be a value set based on the minimum audible magnitude. Next, the audio signal processing apparatus may calculate a second average of loudness measurement values having a loudness level equal to or greater than the second threshold value among the loudness measurement values used for calculating the first average. In this case, the second threshold value may be a value obtained by subtracting a preset value from the first average. Furthermore, the audio signal processing apparatus may use the second average as the integrated loudness level of the input content. Meanwhile, the audio signal processing apparatus may reset the setup point of time for the integrated loudness level according to specific requirements. A method for resetting the setup point of time for the integrated loudness level by the audio signal processing apparatus will be described later with reference to FIG. 6.

Next, the audio signal processing apparatus may obtain a loudness gain applied to the input content based on the obtained loudness information (S203). Specifically, the audio signal processing apparatus may obtain a loudness gain based on the loudness information and the target loudness level. According to an embodiment, the audio signal processing apparatus may obtain a loudness gain applied to a specific frame of the input content. The loudness gain applied for each frame in some specific sections of the input content may be dynamically adjusted over time. The loudness gain applied for each frame in the remaining sections except for the specific sections may be a static gain that is not dynamically adjusted. In addition, in some specific sections of the input content, the loudness gain may be limited to a value within a specific range.

Next, the audio signal processing apparatus may adjust the output loudness level of the input content based on the loudness gain (S205). For example, the audio signal processing apparatus may adjust the output loudness level by applying the loudness gain to the input content. According to an embodiment, the loudness gain may be applied for each of the frames constituting the input content. In this case, the audio signal processing apparatus may adjust the output loudness level of the input content by multiplying the audio signal corresponding to each frame by the loudness gain. The audio signal processing apparatus may obtain output content of which the output loudness level is adjusted by the loudness gain from the input content. Furthermore, the audio signal processing apparatus may output the obtained output content. For example, the audio signal processing apparatus may play the output content. Alternatively, the audio signal processing apparatus may transfer the output content to a playback device via a wired/wireless interface.

In addition, the audio signal processing apparatus may control the dynamic range of the adjusted output loudness level. This is because, when the output loudness level for a specific frame of the input content is out of a preset dynamic range, sound quality distortion may occur due to clipping. The audio signal processing apparatus may control the dynamic range of the output loudness level based on the preset dynamic range. For example, the audio signal processing apparatus may control the dynamic range of the output loudness level by using processing such as a limiter and dynamic range control (DRC).

When the audio signal processing apparatus plays content in real time, for example, when the audio signal processing apparatus plays real-time streaming content, non-linear processing may be applied to the audio signal. Specifically, the DRC processing described above may be applied. Since non-linear processing affects the loudness of the output audio signal, the audio signal processing apparatus has to adjust the loudness of the audio signal considering a loudness deviation, which is a deviation of the loudness of the nonlinear processing input audio signal and the loudness of the nonlinear processing output audio signal, which may result from nonlinear processing. However, in the case of the nonlinear processing, the output signal is processed nonlinearly unlike linear processing, and thus it is difficult to predict the difference between the loudness of the input signal and the loudness of the output signal before the nonlinear processing is applied. Therefore, when the audio signal processing apparatus has to process an audio signal in real time, a method is required that is capable of efficiently predicting a loudness deviation caused by nonlinear processing. To solve the above-mentioned problem, metadata including loudness distribution information of an audio signal included in the content may be used. This will be described with reference to FIGS. 3 to 6.

Figure 3:
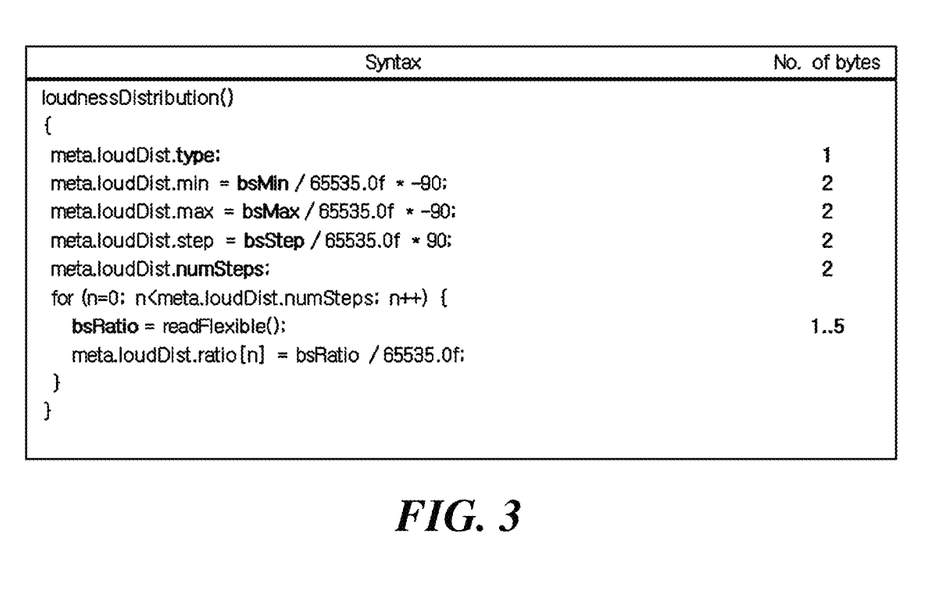
FIG. 3 illustrates a syntax of metadata including loudness distribution information according to an embodiment of the present disclosure.

FIG. 3 illustrates a syntax of metadata including loudness distribution information according to an embodiment of the present disclosure.

As described above, the metadata used by the audio signal processing apparatus may include information on loudness distribution. For convenience of description, the information on loudness distribution is referred to as loudness distribution information. In this case, the loudness distribution information may be a loudness histogram. Specifically, the loudness distribution information may be a normalized histogram. According to a specific embodiment, the metadata may include loudness distribution information indicating, for each of a plurality of steps separated according to a loudness magnitude, a ratio between an amount of an audio signal corresponding to each of the plurality of steps of the audio signal and a total amount of the audio signal. In this case, the loudness may be measured within a specified time interval. For example, the metadata may represent a ratio of the number of specified time intervals corresponding to each step to the total number of time intervals. For convenience of description, the ratio between the amount of the audio signal corresponding to each of the plurality of steps and the total amount of the audio signal is referred to as an audio signal ratio. Furthermore, the specified time interval may be a frame of the audio signal. The loudness distribution information may include information indicating a type of loudness, which serves as a reference. The type of loudness may be classified according to a length of a time interval in which the loudness is measured. For example, the type of loudness may represent at least one of the short-term loudness and the momentary loudness. Specifically, the loudness distribution information may have syntax as shown in FIG. 3.

In FIG. 3, "type" represents the type of loudness indicated by the loudness distribution information. As described above, the type of loudness may represent a type based on the length of a time interval in which the loudness of the loudness distribution information is measured. bsMin may represent a minimum value of the loudness coded in the loudness distribution information. bsMax may represent a maximum value of the loudness coded in the loudness distribution information. bsStep may represent the magnitude of the loudness step used in the loudness distribution information. numSteps may represent the total number of steps included in the loudness distribution information. bsRatio may represent a ratio between the amount of the audio signal corresponding to each of plurality of steps and the total amount of the audio signal in the loudness distribution information. Specifically, bsRatio may be a value representing a ratio between a value for each step and the sum of values for all steps in the loudness histogram. That is, bsRatio may be the audio signal ratio described above.

The audio signal ratio for each step included in the loudness distribution information may be encoded as a variable-length bit string. This is because the difference in the audio signal ratio for each step may be large. Accordingly, when the audio signal ratio is encoded as a variable-length bit string, the loudness distribution information may be encoded with a much smaller number of bits than when the audio signal ratio is encoded as a fixed-length bit string. Specifically, the audio signal ratio corresponding to each of a plurality of steps may be included in one bit string. In this case, the bit string may include an ending flag repeatedly positioned by a predetermined number and indicating the last bit of bits representing the audio signal ratio corresponding to each step. Specifically, the ending flag may be repeatedly positioned every 8 bits. In addition, when the value of the ending flag is a predetermined value, the bit immediately before the ending flag may be the last bit of the audio signal ratio. In this case, the predetermined value may be 1.

In the specific embodiment, the audio signal processing apparatus may process the bit string including the audio signal ratio for each step in units of 8 bits. The audio signal processing apparatus obtains values of 7 bits, which is a part of 8 bits, as a part of bits indicating the audio signal ratio and obtains the last 1 bit as the ending flag. When the value of the ending flag is a predetermined value, bits representing the audio signal ratio are obtained by combining bits of the previously obtained audio signal ratio. When the value of the ending flag is not a predetermined value, the audio signal processing apparatus obtains the next 8 bits and repeatedly performs the previously performed operation. The audio signal processing apparatus may obtain the audio signal ratio from the bit stream including an audio signal component for each step according to the syntax of Table 1.

TABLE 1

| Syntax | No. of bytes |
|---|---|
| value = readFlexible( ) { value = 0: for (n=0: n<5: n++) { byte: value += (0×7F & byte) <<(7 * n): if (!(0×80 & byte)) break: } return value: } | 1 |

The audio signal processing apparatus may adjust the loudness of the audio signal based on the loudness distribution information. This will be described with reference to FIGS. 4 and 5.

Figure 4:
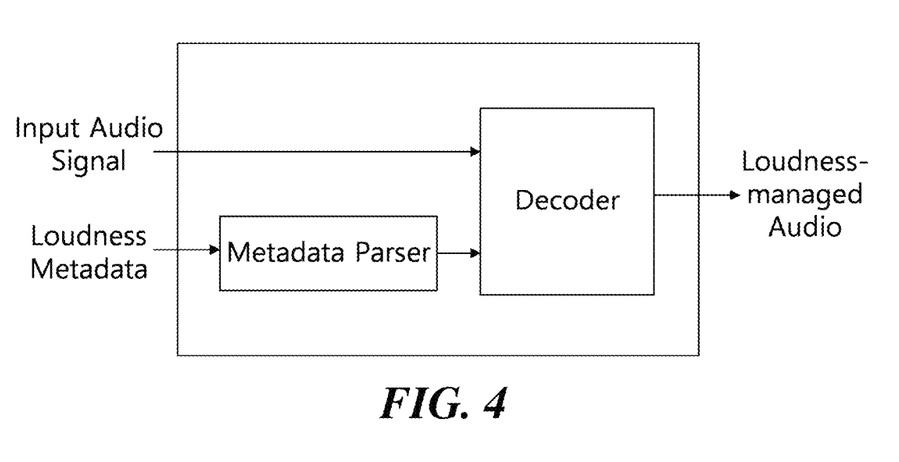
FIG. 4 illustrates a method of adjusting a loudness of an audio signal by using metadata by an audio signal processing apparatus according to an embodiment of the present disclosure.

FIG. 4 illustrates a method for adjusting a loudness of an audio signal by using metadata by an audio signal processing apparatus according to an embodiment of the present disclosure.

As described above, the audio signal processing apparatus may perform nonlinear processing on the audio signal. For example, nonlinear processing may include at least one of DRC or equalizer. In this case, the audio signal processing apparatus may predict a loudness deviation caused by the nonlinear processing based on the loudness distribution information and information on the characteristics of the nonlinear processing. In this case, the information on the characteristics of nonlinear processing may include at least one of a frequency characteristic of nonlinear processing and a gain characteristic of nonlinear processing. For example, the information on the characteristics of the nonlinear processing may include the frequency characteristics of the equalizer. In addition, the information on the characteristics of the nonlinear processing may include a gain characteristics of the DRC.

The audio signal processing apparatus may adjust the loudness of the audio signal based on the loudness deviation caused by nonlinear processing. Specifically, the audio signal processing apparatus may adjust the loudness by a difference between a target loudness and a value obtained by adding the loudness deviation caused by the nonlinear processing to the loudness of the audio signal.

According to an embodiment, the audio signal processing apparatus may apply the nonlinear processing before loudness adjusting. In addition, the audio signal processing apparatus may apply the nonlinear processing after loudness adjusting.

The audio signal processing apparatus may obtain a loudness deviation caused by DRC based on a DRC mapping curve that maps the reference level of the DRC input signal and the reference level of the DRC output signal. The reference level may be an average level, a maximum level (peak value), or a loudness value that are calculated based on a certain section, which is expressed as a linear scale value or a log scale level of the input signal. When the integrated loudness of a DRC input audio signal input to the DRC is $L_I$ and the integrated loudness of an input audio signal input to the audio signal processing apparatus is $L_{I,org}$, the loudness deviation $\Delta L_{prev}$ caused by other processing before DRC can be defined as follows.

$$\Delta L_{prev} = L_I - L_{I,org}$$

The audio signal processing apparatus may adjust the loudness distribution of the input audio signal obtained from the loudness distribution information to the range of the loudness distribution input to the DRC by using $\Delta L_{prev}$. $\Delta L_{prev}$ may be 0 depending on the implementation of the audio signal processing apparatus. Specifically, when the loudness distribution of the audio signal is defined at $-127 < \text{input}_{DB} < 0$, the audio signal processing apparatus may adjust the range of the loudness distribution, $h_{DB}[k(\text{input}_{DB})]$ to $-127 + \Delta L_{prev} < \text{input}_{DB} < \Delta L_{prev}$. Specifically, the audio signal processing apparatus may adjust the range of the loudness distribution of the audio signal to the range of the loudness distribution of the audio signal input to the DRC according to the following equation.

$$h_{DB,prev}[k(\text{input}_{DB})] = h_{DB}[k(\text{input}_{DB} - \Delta L_{prev})]$$

where $k(\text{input}_{DB}) = \text{round}(10\,\text{input}_{DB}) + 1270$ for $\forall \text{input}_{DB}$ in $[-127.0\ 0.0]$ The audio signal processing apparatus may initialize the loudness distribution, $h_{DB,DRC}$, of the audio signal after DRC is applied based on the DRC mapping curve, $\text{drc}_{DB}[K(\text{input}_{DB})]$, from $h_{DB,prev}$ of which the distribution range is adjusted.

$$h_{DB,DRc}[k(\text{drc}_{DB}[k(\text{input}_{DB})])] \mathrel{+}= h_{DB,prev}[k(\text{input}_{DB})]$$

where $k(\text{input}_{DB}) = \text{round}(10\,\text{input}_{DB}) + 1270$ for $\forall \text{input}_{DB}$ in $[-127.0\ 0.0]$ The audio signal processing apparatus may obtain the loudness, $L_{DRC,out}$ of the DRC output audio signal from $h_{DB,DRC}$, and may obtain the loudness deviation $\Delta L_{DRC}$ caused by the DRC therefrom. Specifically, according to ITU-R Recommendation BS.1770-4, the audio signal processing apparatus may obtain, as the loudness $L_{DRC,out}$ of the DRC output audio signal, the average of the distribution above the average value of distribution components obtained by removing the components below the absolute threshold and a relative threshold, $J_O$, derived therefrom. For example, the audio signal processing apparatus may obtain $\Delta L_{DRC}$ according to the following equation.

$$L_{DRC,out} = 10\,\log_{10}\left(\frac{L_j}{N_1}\right) - 0.691$$

where $$L_j = \sum_{\text{input}_{DB}=J_0}^{UL} 10^{\frac{\text{input}_{DB}+0.691}{10}} h_{DB,DRC}[k(\text{drc}_{DB}[k(\text{input}_{DB})])],$$

$$N_j = \sum_{\text{input}_{DB}=J_0}^{UL} h_{DB,DRC}[k(\text{drc}_{DB}[k(\text{input}_{DB})])],$$

$$k(\text{input}_{DB}) = \text{round}(10\,\text{input}_{DB}) + 1270$$

for $\forall\ \text{input}_{DB}$ in $[-127.0\ UL]$, $J_0$ is relative threshold, and $UL = 5$ $$\Delta L_{DRC} = L_{DRC,out} - L_I$$

Figure 5:
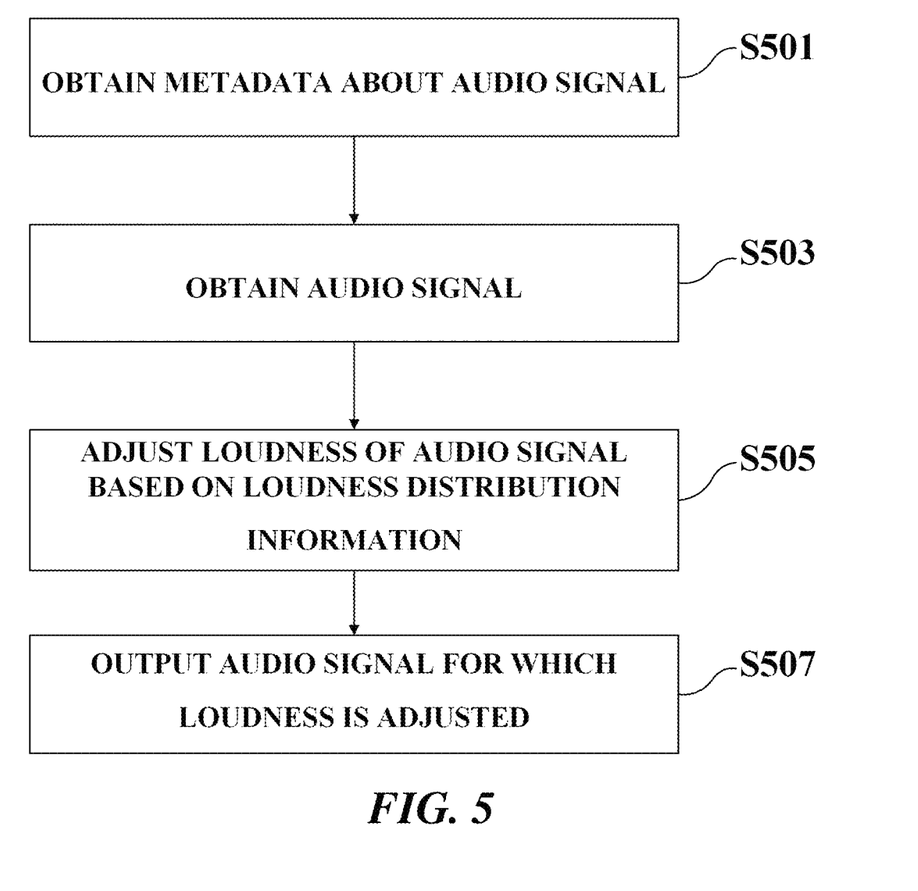
FIG. 5 illustrates a method of operating an audio signal processing apparatus according to an embodiment of the present disclosure.

FIG. 5 illustrates a method of operating an audio signal processing apparatus according to an embodiment of the present disclosure.

The audio signal processing apparatus obtains metadata about an audio signal (S501). In this case, the metadata may include the loudness distribution information described above. In addition, the audio signal processing apparatus may obtain metadata from a transmission file including content including an audio signal. In another specific embodiment, the audio signal processing apparatus may obtain metadata separately from the content including an audio signal.

The audio signal processing apparatus obtains an audio signal (S503). Specifically, the audio signal processing apparatus may obtain an audio signal from a content file including the audio signal. In this case, the content file may be streamed to the audio signal processing apparatus through a network. In another specific embodiment, the audio signal processing apparatus may obtain a content file from a storage medium.

The audio signal processing apparatus adjusts the loudness of the audio signal based on the loudness distribution information (S505). As described above, the audio signal processing apparatus may obtain a loudness deviation caused by nonlinear processing. The audio signal processing apparatus may adjust the loudness of the audio signal based on the obtained loudness deviation. Specifically, the audio signal processing apparatus may adjust the loudness by a difference between a target loudness and a value obtained by adding the loudness deviation caused by the nonlinear processing to the loudness of the audio signal.

The audio signal processing apparatus outputs an audio signal of which the loudness is adjusted (S507).

Figure 6:
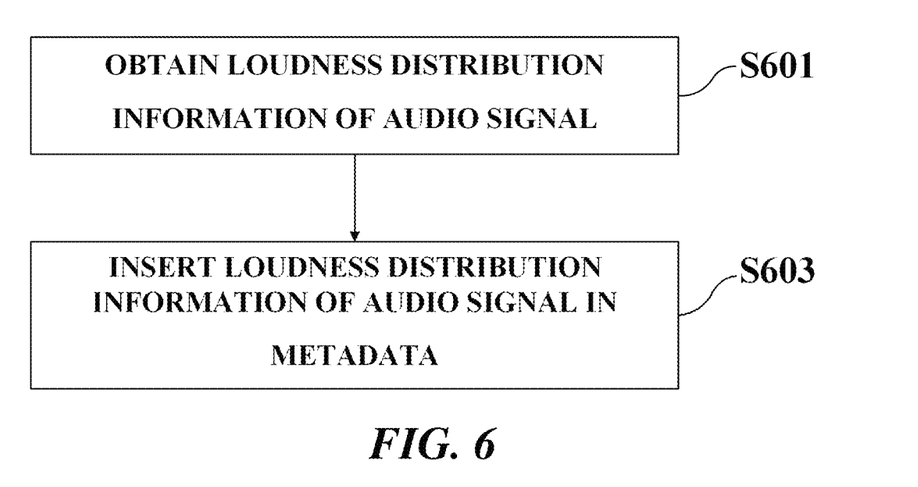
FIG. 6 illustrates a method of generating metadata according to an embodiment of the present disclosure.

FIG. 6 illustrates a method of generating metadata according to an embodiment of the present disclosure.

A metadata generating device obtains loudness distribution information of an audio signal (S601). In this case, the loudness may be measured within a specified time interval. Furthermore, the specified time interval may be a frame of the audio signal. The loudness distribution information may include information indicating a type of loudness, which serves as a reference. The type of loudness may be classified according to a length of a time interval in which the loudness is measured. For example, the type of loudness may represent at least one of the short-term loudness and the momentary loudness.

The metadata generating device inserts loudness distribution information of the audio signal into the metadata (S603). The metadata may include at least one of information on the type of loudness indicated by the loudness distribution information, information indicating the minimum value of the loudness coded in the loudness distribution information, information indicating the maximum value of the loudness coded in the loudness distribution information, information indicating the size of the step of loudness used for the loudness distribution information, information indicating the total number of steps included in the loudness distribution information, and information indicating the audio ratio corresponding to each step in the loudness distribution information. In this case, as described above, the metadata generating device may encode the audio signal ratio for each of the steps included in the loudness distribution information into a bit string having a variable length. The audio signal ratio corresponding to each of a plurality of steps may be included in one bit string. In this case, the bit string may include an ending flag repeatedly positioned by a predetermined number and indicating the last bit of bits representing the audio signal ratio corresponding to each step. Specifically, the metadata generating device may encode an audio signal ratio for each of the steps included in the loudness distribution information in the form described with reference to FIG. 3.

Figure 7:
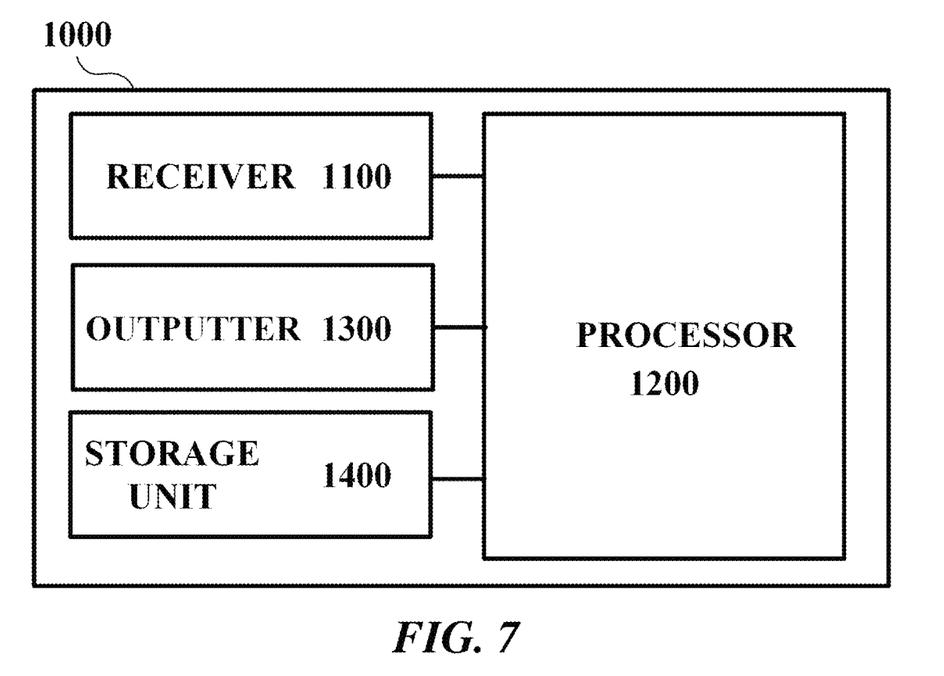
FIG. 7 is a block diagram illustrating a configuration of an audio signal processing apparatus according to an embodiment of the present disclosure.

FIG. 7 is a block diagram illustrating a configuration of an audio signal processing apparatus 1000 according to an embodiment of the present disclosure.

According to an embodiment, the audio signal processing apparatus 1000 may include a receiver 1100, a processor 1200, an outputter 1300, and a storage unit 1400. However, not all of the components illustrated in FIG. 7 are essential components of the audio signal processing apparatus. The audio signal processing apparatus 1000 may additionally include components not illustrated in FIG. 7. In addition, at least some of the components of the audio signal processing apparatus 100 illustrated in FIG. 7 may be omitted. For example, the audio signal processing apparatus according to an embodiment may not include the receiver 1100 and the outputter 1300.

The receiver 1100 may receive input content input to the audio signal processing apparatus 1000. The receiver 1100 may receive input content for which an output loudness level is adjusted by the processor 1200. Specifically, the receiver 1100 may receive input content from an external server through a network. Furthermore, the receiver 1100 may obtain input content from a storage medium. As described above, the input content may include an audio signal. In this case, the audio signal may include at least one of an ambisonic signal, an object signal, or a channel signal. Furthermore, the audio signal may be one object signal or a mono signal. The audio signal may be a multi-object or multi-channel signal. According to an embodiment, the receiver 1100 may include an input terminal for receiving input content transmitted by wire. In addition, the receiver 1100 may include a wireless receiving module for receiving input content transmitted wirelessly.

According to an embodiment, the audio signal processing apparatus 1000 may include a separate decoder. In this case, the receiver 1100 may receive an encoded bitstream of the input content. In addition, the encoded bitstream may be decoded as the input content through a decoder. Additionally, the receiver 1100 may receive metadata related to input content. As described above, the input content may include metadata.

According to an embodiment, the receiver 1100 may include a transmitter/receiver for transmitting and receiving data with an external device through a network. In this case, the data may include at least one of a bitstream or metadata of the input content. The receiver 1100 may include a wired transmission/reception terminal for receiving data transmitted by wire. In addition, the receiver 1100 may include a wireless transmission/reception module for receiving data transmitted wirelessly. In this case, the receiver 1100 may receive data transmitted wirelessly using a Bluetooth or Wi-Fi communication method. Further, the receiver 1100 may receive data transmitted according to a mobile communication standard such as long-term evolution (LTE) and LTE-advanced, and the present disclosure is not limited thereto. The receiver 1100 may receive various types of data transmitted according to various wired and wireless communication standards.

The processor 1200 may control the overall operation of the audio signal processing apparatus 100. The processor 1200 may control each component of the audio signal processing apparatus 100. The processor 1200 may perform calculations and processing of various data and signals. The processor 1200 may be implemented as hardware in the form of a semiconductor chip or an electronic circuit, or may be implemented as software that controls hardware. The processor 1200 may be implemented in a form in which the hardware and the software are combined. For example, the processor 1200 may control operations of the receiver 1100, the outputter 1300, and the storage unit 1400 by executing at least one program. In addition, the processor 1200 may perform the operations described with reference to FIGS. 1 to 9 by executing at least one program.

According to an embodiment, the processor 1200 may adjust the output loudness level of the input content. For example, the processor 1200 may adjust the output loudness level of the input content based on the loudness gain. The loudness information may be a loudness characteristic of the input content analyzed from the input content. In this case, the loudness gain may be obtained based on the loudness information. Furthermore, the processor 1200 may limit the loudness gain based on a first gain allowable range during the gain limit section. The processor 1200 may release a limitation on the loudness gain by using the first gain allowable range in a gain release section following the gain limit section. Furthermore, the processor 1200 may output output content for which an output loudness level is adjusted from the input content. In this case, the processor 1200 may output the output content through the outputter 1300 to be described later.

According to an embodiment, the processor 1200 may obtain metadata. For example, the processor 1200 may receive the metadata through the receiver 1100. The processor 1200 may determine a parameter related to the gain limit based on the metadata. Specifically, the processor 1200 may obtain a duration of the gain limit section based on the metadata. In addition, the processor 1200 may limit the loudness gain of the input content based on the gain allowable range during the duration acquired from a point of time when the gain limit section starts.

The outputter 1300 may output the output content. The outputter 1300 may output the output content for which an output loudness level is adjusted from the input content by the processor 1200. Here, the output content may include an output audio signal. In this case, the output audio signal may include at least one of an ambisonic signal, an object signal, or a channel signal. The output audio signal may be a multi-object or multi-channel signal. In addition, the output audio signal may include a 2-channel output audio signal that corresponds to both ears of the listener, respectively. The output audio signal may include a binaural 2-channel output audio signal. The outputter 1300 may output an audio headphone signal of which an output loudness level is adjusted by the processor 1200.

According to an embodiment, the outputter 1300 may include an outputter for outputting output content. For example, the outputter 1300 may include an output terminal for outputting an output audio signal to the outside. In this case, the audio signal processing apparatus 100 may output an output audio signal to an external device connected to the output terminal. The outputter 1300 may include a wireless audio transmission module for outputting an output audio signal to the outside. In this case, the outputter 1300 may output an output audio signal to an external device using a wireless communication method such as Bluetooth or Wi-Fi.

In addition, the outputter 1300 may include a speaker. In this case, the audio signal processing apparatus 100 may output an output audio signal through the speaker. In addition, the outputter 1300 may additionally include a converter (e.g., digital-to-analog converter (DAC)) for converting a digital audio signal into an analog audio signal. Additionally, the outputter 1300 may include a display for outputting a video signal included in the output content.

The storage unit 1400 may store at least one of data or programs for processing and controlling the processor 1200. For example, the storage unit 1400 may store a loudness measurement value obtained through the processor 1200. Furthermore, the storage unit 1400 may store a result calculated by the processor 1200. For example, the storage unit 1400 may store loudness information obtained based on a loudness measurement value. Furthermore, the storage unit 1400 may store an integrated loudness level calculated by the processor 1200. In addition, the storage unit 1400 may store data input to the audio signal processing apparatus 1000 or output from the audio signal processing apparatus 1000.

The storage unit 1400 may include at least one memory. In this case, the memory may include at least one storage medium of a flash memory type memory, a hard disk type memory, a multimedia card micro type memory, a card type memory (for example, SD or XD memory), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk.

Some embodiments may also be implemented in the form of a recording medium including instructions executable by a computer, such as a program module executed by a computer. The computer-readable media may be any available media that be accessible by a computer, and may include all volatile and nonvolatile media, and removable and non-removable media. Further, the computer-readable medium may include a computer storage medium. The computer storage media include all volatile and non-volatile medium, and removable and non-removable media implemented in any method or technology for storing information such as computer-readable instructions, data structures, program modules, or other data.

Although the present disclosure has been described above through specific embodiments, but those skilled in the art to which the present disclosure belongs can make modifications and changes without departing from the spirit and scope of the present disclosure. That is, although the present disclosure has been described with respect to an embodiment for adjusting the loudness level for the audio signal, the present disclosure is equally applicable and extendable to various multimedia signals including video signals as well as audio signals. Therefore, what could be easily conceived by those skilled in the field upon reading the detailed description and embodiments of the present disclosure is to be construed as falling within the scope of the present disclosure.

The invention claimed is:

1. A method of operating an audio signal processing apparatus playing content including an audio signal, the method comprising:
    receiving the audio signal;
    receiving metadata including information related to a loudness of the audio signal, the metadata including loudness distribution information, for each of a plurality of steps separated according to a loudness magnitude, indicating a ratio between an amount of an audio signal corresponding to each of the plurality of steps of the audio signal and a total amount of the audio signal; and
    adjusting the loudness of the audio signal based on the metadata.

2. The method of claim 1, wherein a value of the ratio for each of the plurality of steps is encoded with a variable length.

3. The method of claim 2, wherein the metadata includes a bit string including the value of the ratio corresponding to each of the plurality of steps separated according to the loudness magnitude, and
    the bit string includes an ending flag repeatedly positioned by a predetermined number and indicating an end of bits representing the ratio corresponding to each of plurality of steps.

4. The method of claim 3, wherein the adjusting the loudness of the audio signal based on the metadata includes obtaining the value of the ratio for each of the plurality of steps by using a bit operation below,

| Syntax | No. of bytes |
| --- | --- |
| value = readFlexible( ) { value = 0: for (n=0: n<5: n++) {   byte:   value += (0×7F & byte) <<(7 * n):   if (!(0×80 & byte)) break: } return value: } | 1 |

5. The method of claim 1, wherein the metadata includes information indicating a type of loudness that is a reference to the loudness distribution information.

6. The method of claim 5, wherein the type of loudness is classified according to a length of a time interval in which the loudness is measured.

7. The method of claim 1, wherein the adjusting the loudness of the audio signal based on the metadata includes adjusting the loudness of the audio signal based on the loudness distribution information and a characteristic of nonlinear processing applied to the audio signal.

8. The method of claim 7, wherein the nonlinear processing includes dynamic range control (DRC).

9. The method of claim 7, wherein the adjusting the loudness of the audio signal based on the loudness distribution information and the characteristic of the nonlinear processing applied to the audio signal includes adjusting the loudness based on a difference between a target loudness and a value obtained by adding a loudness deviation caused by the nonlinear processing to the loudness of the audio signal.

10. A method of generating metadata for content including an audio signal, the method comprising:
    obtaining loudness distribution information of the audio signal, the loudness distribution information indicating, for each of a plurality of steps separated according to a loudness magnitude, a ratio between an amount of the audio signal corresponding to each of the plurality of steps of the audio signal and a total amount of the audio signal; and
    inserting the loudness distribution information in the metadata.

11. The method of claim 10, wherein the inserting the loudness distribution information in the metadata includes encoding the ratio for each of the steps with a variable length.

12. The method of claim 11, wherein the metadata includes a bit string including the audio signal ratio corresponding to each of the plurality of steps separated according to the loudness magnitude, and the bit string includes an ending flag repeatedly positioned by a predetermined number and indicating an end of bits representing the audio signal ratio corresponding to each step.

13. The method of claim 12, wherein the ending flag is repeatedly positioned every 8 bits in the bit string.

14. The method of claim 10, wherein the metadata includes information indicating a type of loudness that is a reference to the loudness distribution information.

15. The method of claim 14, wherein the type of loudness is classified according to a length of a time interval in which the loudness is measured.

16. An audio signal processing apparatus playing content including an audio signal, the audio signal processing apparatus comprising:
 a receiver receiving the audio signal; and
 a processor controlling the audio signal processing apparatus, wherein the processor is configured to:
 receive metadata including information related to a loudness of the audio signal, the metadata including loudness distribution information indicating, for each of a plurality of steps separated according to a loudness magnitude, a ratio between an amount of an audio signal corresponding to each of the plurality of steps of the audio signal and a total amount of the audio signal; and
 adjust the loudness of the audio signal based on the metadata.

17. The audio signal processing apparatus of claim 16, wherein a value of the ratio for each of the plurality of the steps is encoded with a variable length.

18. The audio signal processing apparatus of claim 17, wherein the metadata includes a bit string including the value of the ratio corresponding to each of the plurality of steps separated according to the loudness magnitude, and
 the bit string includes an ending flag repeatedly positioned by a predetermined number and indicating an end of bits representing the ratio corresponding to each step.

19. The audio signal processing apparatus of claim 18, wherein the processor is configured to obtain a value of the ratio for each of the plurality of the steps by using a bit operation below,

| Syntax | No. of bytes |
|---|---|
| value = readFlexible( ) { value = 0: for (n=0: n<5: n++) { byte: value += (0x7F & byte) <<(7 * n): if (!(0x80 & byte)) break: } return value: } | 1 |

20. The audio signal processing apparatus of claim 16, wherein the metadata includes information indicating a type of loudness that is a reference to the loudness distribution information.

* * * * *